United States Patent
Nebendahl et al.

(10) Patent No.: US 6,937,346 B2
(45) Date of Patent: Aug. 30, 2005

(54) WAVEMETER HAVING TWO INTERFERENCE ELEMENTS

(75) Inventors: Bernd Nebendahl, Ditzingen (DE); Andreas Schmidt, Tuebingen (DE); Matthias Jaeger, Jena (DE)

(73) Assignee: Agilent Technologies, Inc., Palo Alto, CA (US)

( * ) Notice: Subject to any disclaimer, the term of this patent is extended or adjusted under 35 U.S.C. 154(b) by 272 days.

(21) Appl. No.: 10/134,578

(22) Filed: Apr. 29, 2002

(65) Prior Publication Data

US 2003/0035121 A1 Feb. 20, 2003

(30) Foreign Application Priority Data

Aug. 17, 2001 (EP) .............................................. 01119892

(51) Int. Cl.[7] .................................................. G01B 9/02
(52) U.S. Cl. ....................................................... 356/519
(58) Field of Search ................................ 356/419, 450, 356/480, 506, 519, 454; 372/20, 32, 55, 57, 58

(56) References Cited

U.S. PATENT DOCUMENTS

| | | | | |
|---|---|---|---|---|
| 4,309,108 A | * | 1/1982 | Siebert ........................ | 356/519 |
| 4,558,950 A | * | 12/1985 | Ulrich et al. ................. | 356/480 |
| 4,896,948 A | * | 1/1990 | Dono et al. .................. | 359/245 |
| 5,982,800 A | * | 11/1999 | Ishihara et al. ............... | 372/57 |
| 6,043,883 A | * | 3/2000 | Leckel et al. ................ | 356/454 |
| 6,215,802 B1 | * | 4/2001 | Lunt ............................ | 372/34 |
| 6,462,876 B1 | * | 10/2002 | O'Brien ....................... | 359/77 |

FOREIGN PATENT DOCUMENTS

| EP | 0 442 738 | 8/1991 |
|---|---|---|
| EP | 1 081 474 | 3/2001 |

OTHER PUBLICATIONS

Clevorn, J., Examiner. European Search Report, Application No. EP 01 11 9892, dated Jan. 30, 2002.

* cited by examiner

*Primary Examiner*—Andrew H. Lee

(57) ABSTRACT

A wavemeter for determining a wavelength of an incident optical beam comprises four optical components, each being arranged in the incident optical beam or in a part of it, providing a path with a respective effective optical length, and generating a respective optical beam with a respective optical power depending on the wavelength of the incident optical beam. The optical powers oscillate periodically with increasing wavelength, and a phase shift of approximately pi/2 is provided between two respective pairs of the four optical components. Respective power detectors are provided, each detecting a respective one of the optical powers. A wavelength allocator is provided for allocating a wavelength to the incident optical beam based on the wavelength dependencies of the detected first, second, third, and fourth optical powers.

19 Claims, 2 Drawing Sheets

WAVEMETER HAVING TWO INTERFERENCE ELEMENTS

BACKGROUND OF THE INVENTION

The present invention relates to wavemeters for determining a wavelength of an optical beam.

Etalons are interference elements for the interference of light. To interfere light an etalon is arranged in an optical beam of the light to be measured or in a part of this beam and the etalon generates an optical signal, whose optical power depends on the wavelength of the optical beam to be measured.

Etalons show a dependency of the generated optical power from the wavelength of the incident optical beam. Generally, an etalon shows a dependency of the generated optical power versus wavelength, which can be described by the use of the Airy formulas. After calibration, the optical power can be measured by use of a photo detector and the wavelength corresponding to the measured optical power is determined.

A stepped etalon providing a transition between the stepped areas is disclosed in EP-A-1081474. A variable wavelength light filter based on an etalon structure is known from EP-A442738.

Basically, in optical communication networks information is transmitted by use of light of a light source (transmitter), an optical fiber and an optical receiver. Typical wavelengths used for optical communication are wavelengths in the range of 850 to 1650 nm, and particularly laser diodes with a wavelength in the range of 850 nm, 1300 nm and 1550 nm are used as light sources.

In wavelength-division-multiplexing (WDM) optical communication systems, information is transmitted simultaneously by a set of laser sources, each generating coherent light with a different wavelength (optical communication channels). Since the bandwidth of opto-electronic transmitters and receivers is limited, narrow channel spacing (typically 1.6 nm) is needed to increase the transmission capacity by using a multiplicity of communication channels. Particularly, in WDM systems there is a need to adjust the wavelength of each laser source very precisely to avoid channel interferences at narrow channel spacing etc.

To adjust the wavelength of the signals of a laser source, it is known to use an expensive and very precisely measuring wavemeter comprising a well-adjusted and complex mechanical arrangement. The wavelength of the signals of the laser source is measured, compared with a desired value by a controller, such as a PC, and the wavelength of the signals of the laser source is automatically adjusted to the desired wavelength.

WO 95/02171 discloses a Fourier-transform spectrometer that contains a birefringent optical component, removing the need for a Michelson interferometer used in conventional instruments. A suitable birefringent element, such as a Wollaston prism, is used to introduce a path difference between two light polarizations. Use of an extended light source so that all areas of the birefringent component are illuminated simultaneously ensures that different positions on the birefringent component correspond to different path differences between the two polarizations. A Fourier-transform of the resulting interferogram at the detector results in the spectral distribution of the input light being obtained. The use of an extended light source permits a Fourier-transform spectrometer with no moving parts to be achieved.

P. Juncar et al: "A new method for frequency calibration and control of a laser", OPTICS COMMUNICATIONS, Vol. 14, No. 4, August 1975, Amsterdam NL, pages 438–441, XP002041763 discloses a method for high-precision measurement of the wave number of monochromatic radiation emitted by a single mode tunable laser. The described apparatus allows a direct measurement of the wave number, and serves as a reference for the stabilization and piloting of the laser frequency.

WO 95/20144 discloses an optical wavelength sensor which consists of a wedge shaped Fabry Perot etalon which exhibits resonance for different optical wavelengths across its width, and an array of detectors that detects the spatial disposition of resonant peaks which occur in the etalon, for comparison with stored peak patterns in a processor, so as to determine the spectral content of the incident light from an optical fiber.

WO 95/10759 discloses a spectral wavelength discrimination system and method that allow the wavelength of a beam of radiation to be accurately determined. The System comprises an optical System for gathering and directing received radiation; a wavelength selective beam-splitter, termed a Linear Wavelength Filter, for directing predetermined fractions of the beam at each wavelength into each of two output beams; a detector for receiving each output beam to sense the intensity of each output beam; and a computer for determining the wavelength of the received radiation. Intensity measurement of the output beams and selected system parameters, including the beamsplitter spectral characteristics and detector sensitivity characteristics are used in a special algorithm for performing Fourier based wavelength-dispersive analysis. The unique solution of the Fourier based -analysis is the wavelength of the beam of radiation.

U.S. Pat. No. 6,043,883 discloses a wavemeter comprising an optical component, which generates an optical beam with an optical power which depends periodic on the wavelength of the incident beam to be measured. This known wavemeter is provided with a second measurement channel, whose periodic signals are shifted by pi/2 relative to the periodic signals in first measurement channel. The first and second measurement channels either comprises a different etalon or the wavemeter comprises a single retardation plate to obtain the desired shift of the signals. After calibration of the wavemeter, the optical power of the beam generated by the optical component is measured, the measured value of the optical power is compared with the power values of the calibration data and the wavelength in the calibration data corresponding to the measured value of the optical power is determined.

SUMMARY OF THE INVENTION

It is an object of the invention to provide an improved wavemeter. The object is solved by the independent claims.

Each interference element provides two periodic transmission functions, which are shifted with respect to each other for different parts of a light beam, while they are created independently of the state of polarization of the incident light beam. This is because the shift is caused by different lengths of the optical paths through the different parts of the interference element. Therefore, it is not necessary to know the state of polarization of the incident light beam or to use a polarizer to define the state of polarization of the incident light beam.

To avoid problems that can arise if the light beam shifts laterally during the use of the inventive interference element, two interference elements with four optical components in total are used instead of one. Thereby, any shift of the beam can be covered as long as the incident beam hits partly all four optical components.

The characteristic properties of each part of each interference element are the same, although some parts cause or each part causes different interference. E.g., any temperature dependency, any wavelength dependency, any pressure dependency or any other dependency of the behavior of each part is the same in the whole interference element.

In a preferred embodiment of the invention, each interference element comprises an etalon. By using such a "split" etalon, it is surprisingly easy to realize the different sections of the interference element and therefore realize a separation of the interference patterns of the resulting parts of the light beam in each section. Either the etalon is a single plate made out of glass or fused quartz and the plate has different thickness in the different sections, or the etalon is build up by using two separate plates, whose inner or outer surface defining a cavity between them. In the latter preferred embodiment, at least one of the plates has different thickness in the different sections, causing the cavity to have different thickness in the different sections. This causes different values of the shift of the periodic signal in the different sections of the etalon.

It is further preferred to put the plates together by using a spacer which is preferably comprising a material with zero or near zero thermal expansion, for example the material Zerodur® which has low temperature expansion. It is even more preferred to make the connection between the spacer and the plates gastight so that there can be used a defined gas in the cavity with a known index of refraction, to maintain a fixed optical length between the plates.

In another embodiment the difference d between the thickness of the cavity in the first section and the cavity in the second section is d≈λ/8, preferably d=λ/8, wherein λ≈ the estimated wavelength of the light of the light beam. This can be realized by evaporating approximately 200 nm of SiO on one of the plates in the first section.

It is preferred to use a respective "split" photodiode to detect the power of the resulting parts of the beam with a single but split photodiode. This brings the advantage that all parts of the photodiode have the same characteristic features.

Moreover, a wavemeter with the "two-split" element can be used accordingly to realize four sections to measure four parts of the light beam.

In this respect it is preferred to use a respective "two-split" photodiode to detect the power of the resulting four parts of the beam.

Other preferred embodiments are shown by the dependent claims.

It is clear that the invention can be partly embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. The components in the drawings are not necessarily to scale, emphasis instead being placed upon clearly illustrating the principles of the present invention. Features that are substantially or functionally equal or similar will be referred to with the same reference sign(s).

DETAILED DESCRIPTION OF THE INVENTION

Figure 1:
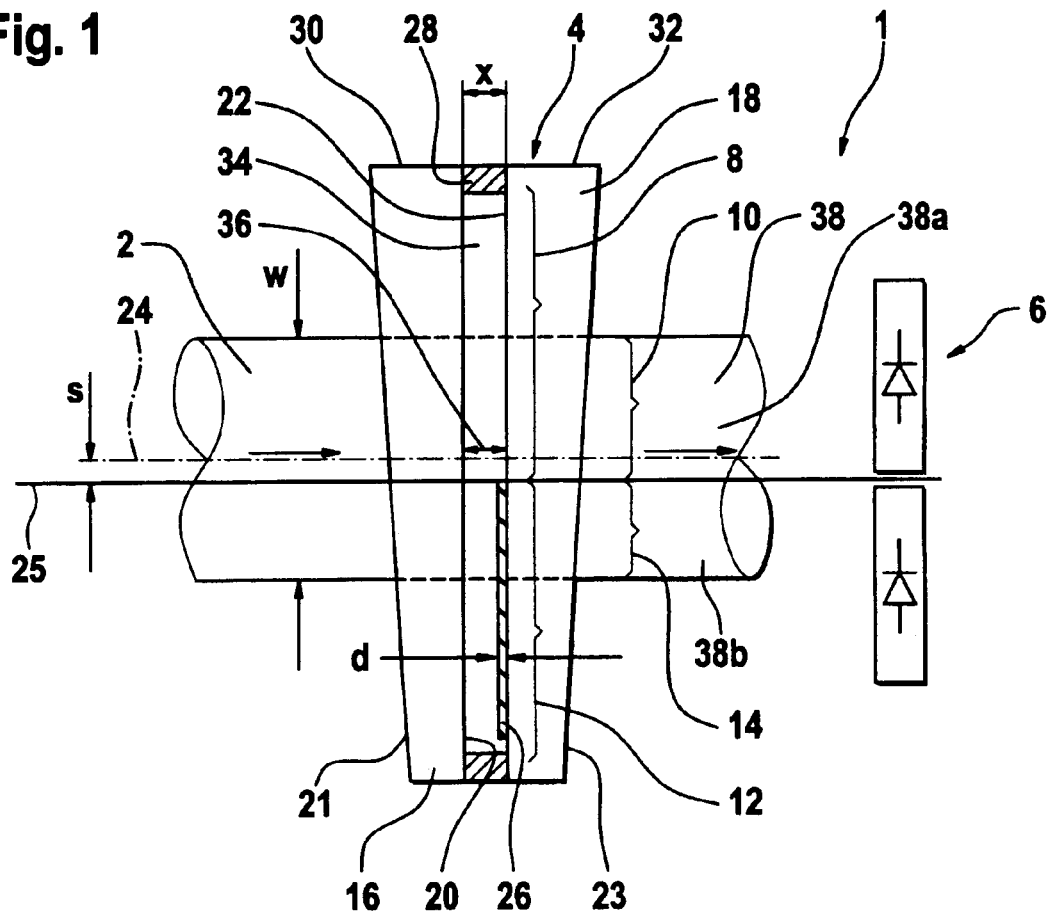
FIG. 1 shows a schematic illustration of a split etalon according to a first embodiment of the invention.

Referring now in greater detail to the drawings, FIG. 1 shows a wavemeter for measuring a wavelength λ of an optical laser beam 2 having a width W. The wavemeter 1 comprises an interference element-4 (e.g., a split elalon 4), a power detector 6 detecting the optical power of the laser beam 2, and an allocator (not shown) allocating a wavelength to said detected optical power.

The split etalon 4 has a first section 8 providing a first path for a first part 10 of the light beam 2, the first path having a first interference—effective optical length x. The split etalon 4 has a second section 12 providing a second path for a second part 14 of the light beam 2, the second path having a second interference—effective optical length l=x−d, where d≈λ/8 of the expected wavelength λ of the laser beam 2. Since the expected wavelength λ in optical communication networks is typically 850–1650 nm the value of d can vary between 100 nm and 210 nm when the wavemeter 1 of FIG. 1 is used as a wavemeter for the above-mentioned optical communication networks. In the embodiment of FIG. 1 the wavelength λ of the laser beam 2 is expected to be 1600 nm so that d was chosen to be 200 nm.

The split etalon 4 is constituted by a first transparent plate 16 and second transparent plate 18. The second plate 18 is positioned remote of the first plate 16. A surface 20 of the plate 16 faces a surface 22 of the plate 18. The surfaces 20 and 22 are plane parallel to each other in each section 8 and 12 of the etalon 4. The distance between the surfaces 20 and 22 in the first section 8 along an axis 25 of the laser beam 2 is x. The distance between the surfaces 20 and 22 in the second section 12 along the axis 25 is l=x−d. This is because only in the second section 12 plate 18 is provided with a coating 26 on its surface 22. The coating 26 has the thickness d along the axis 25.

Therefore, the characteristics of the etalon 4 as an interference element for the laser beam 2 are different in sections 8 and 12 because of the coating 26. This is because the distance between the plates 16 and 18 defines the interference—effective optical length of each section 8 and 12. Therefore, if the distance between the two plates 16 and 18 differs in each section 8 and 12 the interference—effective optical length also differs in each section 8 and 12, i.e. is x in section 8, and is l in section 12. However, all other characteristics besides the interference—effective optical length do not differ between the two sections 8 and 12 since the sections 8 and 12 are sections of a single interference—effective gap 34 between the plates 16 and 18, and each plate 16 and 18 is a homogeneous block of glass having homogeneous characteristics.

Additionally, the outer surfaces 21 and 23 of the plates 16 and 18, which surfaces 21, 23 are not facing the other plate 18, 16 are not parallel to the plates surface 20, 22 facing the other plate 16, 18. By this measure, it is prevented that there occurs interference caused by reflections at the inner surfaces of the plates 16 and 18. Furthermore, the outer surface 21 of the plate 16, which outer surface 21 is hit first by the laser beam 2 is coated with an anti-reflective coating (not shown). This anti-reflective coating hinders the laser beam 2 on being reflected at the outer surface 21.

The plates 16 and 18 are partly connected to each other by a spacer ring 28 made out of Zerodur®. The spacer ring 28 connects the outer edges 30 and 32 of each plate 16 and 18. The outer edges 30 and 32 define circles, i.e. the plates 16 and 18 each having the shape of a circular disc.

By the spacer ring 28, the size of the gap 34 is kept constant and the gap forms a cavity between the plate 16 and 18. The gap 34 is filled with a gas, preferably an inert gas. However, the gap 34 can be filled with any transparent material as long as the material in the gap 34 has a different refractive index than the refractive index of the plates 16 and 18 made out of glass. Because of this difference between the refractive index between the material in the gap 34 and the refractive index of the plates 16 and 18 the laser beam 2 is multiple times reflected within the etalon 4, i.e. in the gap 34 between the surfaces 20 and 22 of the plates 16 and 18, a multiple reflection being indicated by an arrow. The multiple reflection 36 causes interference in the laser beam 2, resulting in a oscillating light intensity or optical power of the resulting beam 38 leaving the etalon 4 depending on the wavelength λ of the initial laser beam 2.

Figure 2:
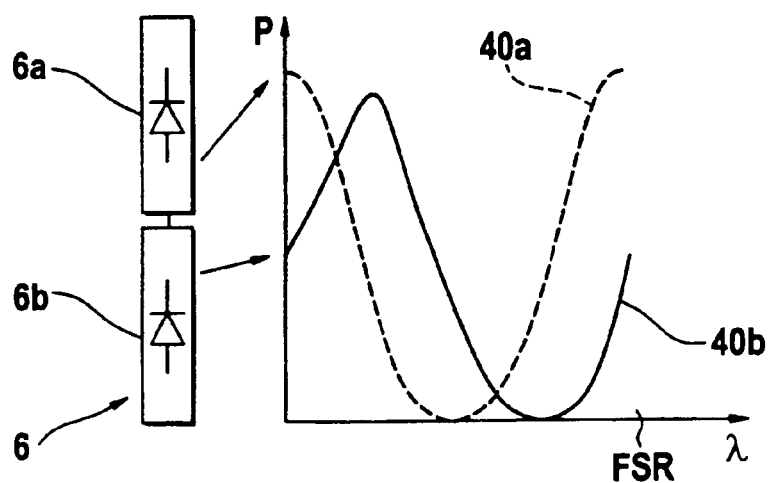
FIG. 2 shows a schematic illustration of the split photodiode of FIG. 1 together with a graph showing the detected power of each part of the split photodiode.

By the aid of the power detector 6, the power of the resulting light beam 38 can be detected dependant on the wavelength λ of the initial laser beam 2 as shown in FIG. 2. Since the etalon 4 has two sections 8 and 12 having different interference—effective optical lengths x and l=x−d, respectively, the interference pattern of a part 38a of the resulting beam 38 having traveled through section 8 differs from a part 38b of the resulting beam 38 having traveled through the section 12. This is shown in FIG. 2. In FIG. 2 the dashed line 40a shows the detected power P of the beam 38a in its dependence on the wavelength λ of the initial laser beam 2, and the solid line 40b shows the detected power P of the part 38b of the resulting beam 38 in its dependence on the wavelength λ of the initial laser beam 2.

To measure each part 38a and 38b of the resulting beam 38 accurately the power detector 6 is a split power detector 6 having a first photodiode 6a detecting part 38a of beam 38 and a second photodiode 6b detecting part 38b of beam 38. However, photodiodes 6a and 6b are part of a single power detector 6, therefore each photodiode 6a, 6b has identical characteristics, i.e. temperature dependency, wavelength dependency, pressure dependency, humidity dependency, of each photodiode 6a, 6b is identical.

Therefore, having calibrated the wavemeter 1, it is possible by the measurement of the electrical current generated by each photodiode 6a and 6b to determine the wavelength of the initial beam 2 by a comparison of the detected values of the power P by each photodiode 6a and 6b with the calibration data and by allocating the corresponding wavelength on the basis of the calibration data. Because of the periodicity of the dependency of the electrical current on the wavelength of beam 2 a correct allocation of the wavelength corresponding to the measured electrical current P can only be made if the measured wavelength is within the so-called free spectral range (FSR) as indicated in FIG. 2. This also determines the value of x. The bigger the value of x is chosen the more precise the measurement, the smaller the value of x is chosen the bigger the FSR. The latter makes it easier to determine with the help of an additional sensor in which FSR the measurement is performed. Additionally, one should know before performing the measurement in which wavelength range the wavelength λ to be measured can be expected. However, since by introducing the coating 26 interference patterns represented by dashed line 40a and solid line 40b are shifted by π/2 with respect to each other, it is possible to allocate the wavelength λ of the initial light beam 2 to the measured values of the power P unambiguously.

Figure 3:
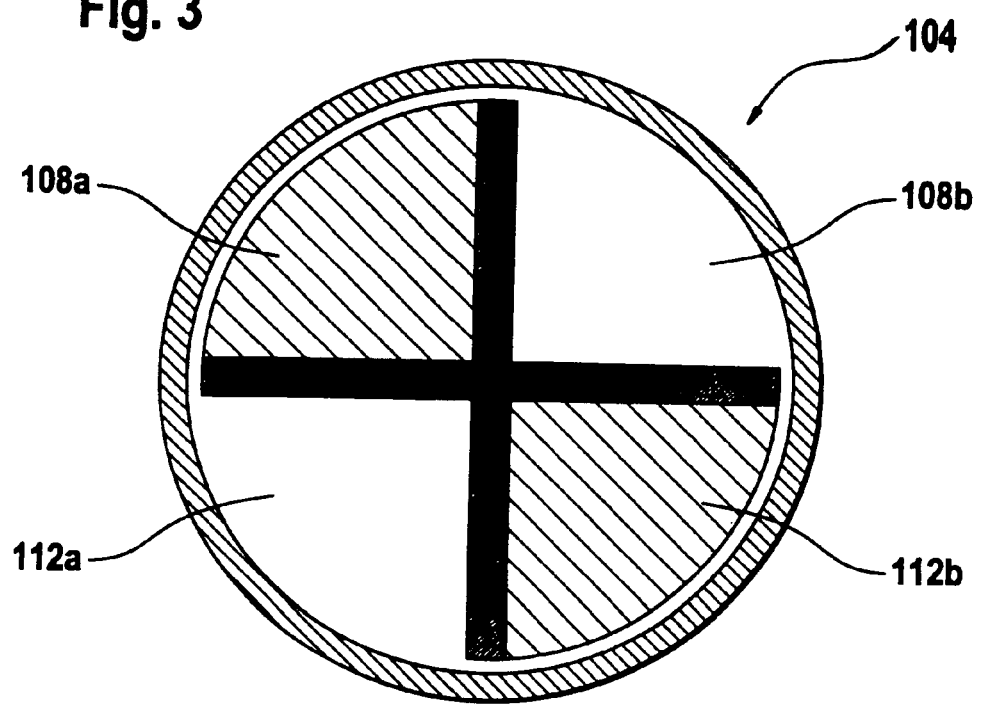
FIG. 3 shows a schematic illustration of a two-split etalon according to a second embodiment of the invention.

FIG. 3 shows a second embodiment of the present invention. FIG. 3 only schematically shows an interference element 104 in a schematic front side view. The interference element 104 has not only two sections as in the embodiment of FIG. 1 but has four sections 108a, 108b, 112a, 112b. The interference—effective optical lengths of sections 108a and 112b are identical with each other, so are the interference—effective optical lengths of sections 108b and 112a. Therefore, with the embodiment shown in FIG. 3 it is provided a two-split interference element 104.

Figure 4:
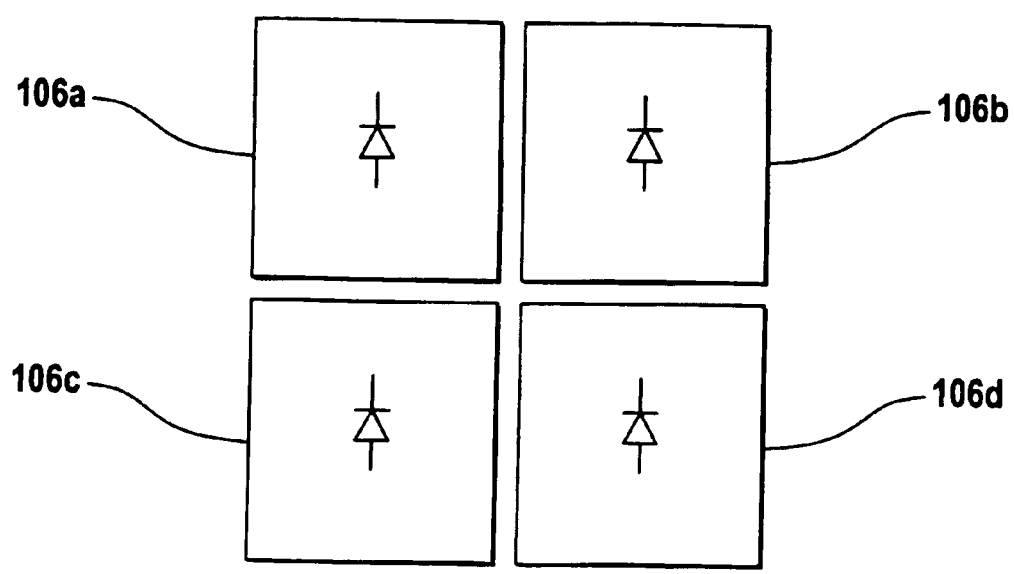
FIG. 4 shows a two-split photodiode to be used together with the two-split etalon of FIG. 3.

Accordingly, a wavemeter (not shown) using the two-split interference element 104 according to the embodiment of FIG. 3 uses a two-split power detector 106 shown in FIG. 4 having four photodiodes 106a, 106b, 106c, 106d. Therefore, it is possible to measure the power of each resulting part of the initial beam 2 leaving sections 108a, 108b, 112a, 112b independently from each other by having a photodiode 106a for section 108a, a photodiode 106b for section 108b, a photodiode 106c for section 112a and a photodiode 106d for section 112b. This embodiment is preferred because it avoids problems which may arise in embodiment 1 of FIG. 1 and 2. It can happen that axis 25 of beam 2 shifts laterally by a length S with respect to an ideal position of the axis 25, the ideal position being indicated by reference sign 24. However, in the results this shift can be distinguished from a wavelength change since beam 2 is detected by four detectors 106a, 106b, 106c, 106d according to the invention. This is because in a certain range the initial light beam 2 always hits two different sections 108a, 108b, 112a, 112b of the interference element 104 of the second embodiment according to FIG. 3.

What is claimed is:

1. A wavemeter for determining a wavelength of an incident optical beam, comprising:
   a first interference element having a first optical component and a second optical component,
      the first optical component providing a first path with a first effective optical length x, x >0, being arranged in said incident optical beam or in a part of it, and generating a first optical beam with a first optical power depending on the wavelength of said incident optical beam,
      the second optical component providing a second path with a second effective optical length l=x−d, x>d>0, being arranged in said incident optical beam or in a part of it, and generating a second optical beam with a second optical power depending on the wavelength of said incident optical beam,
      whereby said first and second optical powers oscillate periodically with increasing wavelength, and said second optical beam having a phase shift of approximately pi/2 with respect to said first optical beam,
   a first power detector detecting the first optical power,
   a second power detector detecting said second optical power,
   a second interference element having a third optical component and a fourth optical component, the third optical component providing a third path with a third effective optical length x', x'>0, being arranged in said incident optical beam or in a part of it, and generating a third optical beam with a third optical power depending on the wavelength of said incident optical beam, the fourth optical component providing a fourth path with a fourth effective optical length l'=x'−d, x'>d>0, being arranged in said incident optical beam or in a part of it, and generating a fourth optical beam with a fourth optical power depending on the wavelength of said incident optical beam, whereby said third and fourth optical powers oscillate periodically with increasing wavelength, and said fourth optical beam having a phase shift of approximately pi/2 with respect to said third optical beam, wherein said first, second, third and fourth optical components are arranged such that said incident optical beam may experience a lateral shift, yet remain at least partial incident on each of said first, second, third and fourth optical components, a third power detector detecting the third optical power, a fourth power detector detecting said fourth optical power, and a wavelength allocator for allocating a wavelength to the incident optical beam based on the wavelength dependencies of the detected first, second, third, and fourth optical powers, wherein the second optical component and the fourth optical component are positioned diametrical to each other with respect to a surface of a plate.

2. The wavemeter of claim 1, wherein the first optical component is a first section of an etalon, and the second optical component is a second section of the etalon.

3. The wavemeter of claim 2, wherein the etalon comprises:

a first transparent plate and a second transparent plate, the second plate being positioned remote of the first plate, a distance between the plates along the first path being x, a distance between the plates along the second path being l.

4. The wavemeter of claim 3, wherein the surfaces of the plates which face each other are plane parallel in each section.

5. The wavemeter of claim 3, wherein in the first optical component one of the plates has a first thickness y, y≧0, along the way of the first path through this plate, and in the second optical component one of the plates has a second thickness k=y+d along the way of the second path through this plate.

6. The wavemeter of claim 3, wherein the plates are at least partly connected to each other by at least one spacer block or ring thereby providing a cavity between the plates.

7. The wavemeter of claim 6, wherein the spacer comprises a material having a thermal expansion of about zero.

8. The wavemeter of claim 3, wherein a surface of at least one of the plates, which surface is not facing the other plate, is not parallel to the plate's surface facing the other plate.

9. The wavemeter of claim 3, wherein at least one surface of the plates, preferably the surface which the light beam hits first, is coated with an anti-reflective coating.

10. The wavemeter of claim 1, wherein d≈λ/8, preferably d=λ/8, with λ representing the estimated wavelength of the incident optical beam.

11. The wavemeter of claim 2, wherein the third optical component is a third section of the etalon, and the fourth optical is a fourth section of the etalon.

12. The wavemeter of claim 3, wherein the etalon further comprises a third transparent plate and a fourth transparent plate, the fourth transparent plate being positioned remote of the third transparent plate, a distance between the third and fourth transparent plates along the third path being x, a distance between the third and fourth transparent plates along the fourth path being l=x−d.

13. The wavemeter of claim 12, wherein in the third optical component one of the plates has the thickness y along the way of the third path through this plate, and in the fourth optical component one of the plates has the thickness k=y+d along the way of the fourth path through this plate.

14. A wavemeter for determining a wavelength of an incident optical beam, comprising:

a first interference element having a first optical component and a second optical component, the first optical component providing a first path with a first effective optical length x, x>0, being arranged in said incident optical beam or in a part of it, and generating a first optical beam with a first optical power depending on the wavelength of said incident optical beam, the second optical component providing a second path with a second effective optical length l=x−d, x>d>0, being arranged in said incident optical beam or in a part of it, and generating a second optical beam with a second optical power depending on the wavelength of said incident optical beam, whereby said first and second optical powers oscillate periodically with increasing wavelength, and said second optical beam having a phase shift of approximately pi/2 with respect to said first optical beam, a first power detector detecting the first optical power, a second power detector detecting said second optical power, a second interference element having a third optical component and a fourth optical component, the third optical component providing a third path with a third effective optical length x', x'>0, being arranged in said incident optical beam or in a part of it, and generating a third optical beam with a third optical power depending on the wavelength of said incident optical beam, the fourth optical component providing a fourth path with a fourth effective optical length l'=x'−d, x'>d>0, being arranged in said incident optical beam or in a part of it, and generating a fourth optical beam with a fourth optical power depending on the wavelength of said incident optical beam, whereby said third and fourth optical powers oscillate periodically with increasing wavelength, and said fourth optical beam having a phase shift of approximately pi/2 with respect to said third optical beam, a third power detector detecting the third optical power, a fourth power detector detecting said fourth optical power, and a wavelength allocator for allocating a wavelength to the incident optical beam based on the wavelength dependencies of the detected first, second, third, and fourth optical powers, wherein first and the third optical components are positioned diametrical to each other with respect to a surface of a plate.

15. The wavemeter of claim 1, wherein the first, second, third, and fourth optical components are provided by a single interference element.

16. The wavemeter of claim 1, wherein the first effective optical length x substantially equals the third effective optical length x', and the second effective optical length l substantially equals the fourth effective optical length l'.

17. A wavemeter for determining a wavelength of an incident optical beam, comprising:
four optical components, each being arranged in the incident optical beam or in a part of it, providing a path with a respective effective optical length, and generating a respective optical beam with a respective optical power depending on the wavelength of said incident optical beam, wherein the optical powers oscillate periodically with increasing wavelength, and a phase shift of approximately pi/2 is provided between two respective pairs of the four optical components, wherein said four optical components are arranged such that said incident optical beam may experience a lateral shift, yet remain at least partial incident on each of said four optical components, wherein two of the four optical components are positioned diametrical to each other with respect to a surface of a plate,
four power detectors, each detecting a respective one of the optical powers, and
a wavelength allocator for allocating a wavelength to the incident optical beam based on the wavelength dependencies of the detected first, second, third, and fourth optical powers.

18. An apparatus for the adjustment of the wavelength of an optical source of an incident optical beam, comprising:
a wavemeter for determining a wavelength of an incident optical beam, having:
four optical components, each being arranged in the incident optical beam or in a part of it, providing a path with a respective effective optical length, and generating a respective optical beam with a respective optical power depending on the wavelength of said incident optical beam, wherein the optical powers oscillate periodically with increasing wavelength, and a phase shift of approximately pi/2 is provided between two respective pairs of the four optical components, wherein said four optical components are arranged such that said incident optical beam may experience a lateral shift, yet remain at least partial incident on each of said four optical components,
four power detectors, each detecting a respective one of the optical powers, and
a wavelength allocator for allocating a wavelength to the incident optical beam based on the wavelength dependencies of the detected first, second, third, and fourth optical powers, wherein two of the four optical components are positioned diametrical to each other with respect to a surface of a plate,
a comparator for comparing the determined wavelength of said incident optical beam with a predefined wavelength; and
a controller for controlling said optical source to generate a modified incident optical beam with said predefined wavelength based on the result of the comparison carried out by said comparator.

19. An apparatus for the adjustment of the wavelength of an optical source of an incident optical beam, comprising: a wavemeter of claim 1, a comparator which compares the measured wavelength of said incident optical beam with a predefined wavelength, and a controller controlling said optical source to generate a modified incident optical beam with said predefined wavelength based on the result of the comparison carried out by said comparator.

* * * * *